(12) United States Patent
Hotaka

(10) Patent No.: US 7,079,418 B2
(45) Date of Patent: Jul. 18, 2006

(54) SEMICONDUCTOR STORAGE APPARATUS AND MICROCOMPUTER HAVING THE SAME

(75) Inventor: Kazuo Hotaka, Saitama-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/980,960

(22) Filed: Nov. 3, 2004

(65) Prior Publication Data

US 2005/0117396 A1 Jun. 2, 2005

(30) Foreign Application Priority Data

Nov. 6, 2003 (JP) .............................. 2003-376633

(51) Int. Cl.
*G11C 11/34* (2006.01)
*G11C 11/00* (2006.01)
*G06F 12/00* (2006.01)

(52) U.S. Cl. .................. 365/185.21; 365/158; 711/163

(58) Field of Classification Search ........... 365/185.21, 365/158, 185.2; 711/163; 327/31, 52, 89, 327/96, 127, 246, 266
See application file for complete search history.

(56) References Cited

U.S. PATENT DOCUMENTS

| | | | | |
|---|---|---|---|---|
| 4,761,765 A | * | 8/1988 | Hashimoto | ............. 365/185.21 |
| 5,258,958 A | * | 11/1993 | Iwahashi et al. | ........ 365/185.21 |
| 5,856,748 A | * | 1/1999 | Seo et al. | ...................... 327/53 |
| 6,075,738 A | * | 6/2000 | Takano | ........................ 365/210 |
| 6,707,693 B1 | * | 3/2004 | Ichiriu | .......................... 365/49 |
| 6,791,869 B1 | * | 9/2004 | Ooishi | ......................... 365/158 |
| 6,791,890 B1 | * | 9/2004 | Ooishi | ......................... 365/201 |
| 2004/0130943 A1 | * | 7/2004 | Hirano et al. | .......... 365/185.01 |

FOREIGN PATENT DOCUMENTS

JP 11-283379 10/1999

* cited by examiner

*Primary Examiner*—Amir Zarabian
*Assistant Examiner*—Anthan Tran
(74) *Attorney, Agent, or Firm*—SoCal IP Law Group LLP; Steven C. Sereboff

(57) ABSTRACT

Disclosed are a semiconductor storage apparatus and a microcomputer incorporating the same. The semiconductor storage apparatus has a nonvolatile memory and a first sense amplifier comparing the level of a read-out signal read out from the nonvolatile memory with a first reference level. The semiconductor storage apparatus comprises a detector operable to output, when detecting that a difference between the level of the read-out signal and the first reference level is smaller than a predetermined level difference, a detection signal indicative of the difference being smaller than the predetermined level difference.

7 Claims, 5 Drawing Sheets

| | SENSE AMPLIFIER FOR MRG1 | SENSE AMPLIFIER FOR NORMAL | SENSE AMPLIFIER FOR MRG0 | ERROR DETERMINATION RESULT |
|---|---|---|---|---|
| (a) $V_r > V_{mrg1}$ | 1 | 1 | 1 | NORMAL |
| (b) $V_{mrg1} > V_r > V_{normal}$ | 0 | 1 | 1 | ABNORMAL |
| (c) $V_{normal} > V_r > V_{mrg0}$ | 0 | 0 | 1 | ABNORMAL |
| (d) $V_{mrg0} > V_r$ | 0 | 0 | 0 | NORMAL |

$V_r$: READ-OUT VOLTAGE $V_{mrg1}$: THRESHOLD VOLTAGE OF THE SENSE AMPLIFIER FOR MRG1

$V_{normal}$: THRESHOLD VOLTAGE OF THE SENSE AMPLIFIER FOR NORMAL $V_{mrg0}$: THRESHOLD VOLTAGE OF THE SENSE AMPLIFIER FOR MRG0

($V_{mrg1} > V_{normal} > V_{mrg0}$)

SEMICONDUCTOR STORAGE APPARATUS AND MICROCOMPUTER HAVING THE SAME

A portion of the disclosure of this patent document contains material which is subject to copyright protection. This patent document may show and/or describe matter which is or may become trade dress of the owner. The copyright and trade dress owner has no objection to the facsimile reproduction by any one of the patent disclosure as it appears in the Patent and Trademark Office patent files or records, but otherwise reserves all copyright and trade dress rights whatsoever.

RELATED APPLICATION INFORMATION

The present application claims priority upon Japanese Patent Application No. 2003-376633 filed on Nov. 6, 2003, which is herein incorporated by reference.

BACKGROUND OF THE INVENTION

1. Field of the Invention

The invention relates to a semiconductor storage apparatus and a microcomputer having the same.

2. Description of the Related Art

As to a nonvolatile semiconductor storage apparatus such as a flash memory and an EEPROM capable of deleting and rewriting electrically and retaining the stored data even when the power of the apparatus is turned off, FIG. 4 shows an example of the structure of a memory cell of the nonvolatile semiconductor storage apparatus. The memory cell provided to the semiconductor storage apparatus has a floating gate through insulating films 43 and 44 between a control gate 41, and a drain 45 and a source 46. Injection and release of electrons into/from the floating gate 42 are carried out by applying a predetermined voltage to the control gate 41, the drain 45 and the source 46. See for example Japanese Patent Application Laid-open Publication No. 1999-283379.

Here, when electrons are injected into the floating gate 42 and a negative charge is accumulated, a predetermined positive voltage applied to the control gate 41 is canceled by this negative charge and the state of conduction between the drain 45 and the source 46 becomes "not conducted (OFF)". On the other hand, when electrons are released from the floating gate 42 and the charge is eliminated, a current flows between the drain 45 and the source 46 and the state becomes "conducted (ON)" due to application of a predetermined positive voltage to the control gate 41.

In the semiconductor storage apparatus, in order to identify the conducted state and the not-conducted state between the drain 45 and the source 46, as shown in FIG. 5, a sense amplifier (hereinafter, referred to as "sense amplifier for NORMAL) is provided, that compares a read-out voltage Vr (positive side) with a predetermined threshold voltage Vnormal (negative side) from a predetermined strobe position of the memory cell and outputs a voltage Vout indicating a logical value "0 (not conducted)" or a logical value "1 (conducted)". For example, in the case where the state of conduction between the drain 45 and the source 46 is not conductive, the read-out voltage Vr becomes lower than the threshold voltage Vnormal and the sense amplifier 12 for NORMAL outputs the voltage Vout indicating the logical value "0". On the other hand, in the case where the state of conduction between the drain 45 and the source 46 is conductive, the read-out voltage Vr becomes equal to or higher than the threshold voltage Vnormal and the sense amplifier 12 for NORMAL outputs the voltage Vout indicating the logical value "1".

By the way, maintaining predetermined specification as the data retention characteristics is required to a nonvolatile semiconductor storage apparatus. However, "data retention" and "read disturb" are faults for the specifications. Data retention refers to a fault in which electrons are gradually injected into the floating gate for some reason regardless of whether the power is turned on or off in the state where electrons are released from the floating gate by the cancellation. Read disturb refers to a fault in which electrons injected into the floating gate by writing operation are gradually released by repeating reading operation for many times.

Here, the fact is known that electrons injected into the floating gate are electronically trapped in the insulating films around the floating gate or vanished by heat energy due to degradation of the memory cell accompanied by use of the semiconductor storage apparatus over time, etc. and, therefore, the data retention and the read disturb become more serious.

FIG. 6 illustrates the input/output characteristics of the memory cell in the semiconductor storage apparatus. A gate voltage Vg shown in the figure is a voltage applied to the control gate when data stored and retained in the memory cell are read out. As the data retention or the read disturb becomes more serious, the input/output characteristics of the memory cell in the case where a charge is present in the floating gate, shifts from 50a to 50b. Therefore, the level of the read-out voltage Vr of the memory cell decreases from Va to Va'. Va' is arranged to be equal to or higher than Vnormal. That is, in the sense amplifier 12 for NORMAL, the difference between the read-out voltage Vr and the threshold voltage Vnormal indicating a section (hereinafter, referred to as "MRG (Margin) 1") for which the logical value becomes "1" decreases from |Va−Vnormal| to |Va'−Vnormal|.

On the other hand, similarly, in the case where a charge is not present in the floating gate, as the data retention or the read disturb becomes more serious, the input/output characteristics of the memory cell shifts from 51a to 51b. Therefore, the level of the read-out voltage Vr of the memory cell increases from Vb to Vb'. Vb' is arranged to be lower than Vnormal. That is, in the sense amplifier 12 for NORMAL, the difference between the read-out voltage Vr and the threshold voltage Vnormal indicating a section (hereinafter, referred to as "MRG (Margin) 0") for which the logical value becomes "0" decreases from |Vnormal−Vb| to |Vnormal−Vb'|.

However, even when the read-out voltage Vr of the memory cell varies from Va to Va' or from Vb to Vb' as the data retention or the read disturb becomes more serious, the sense amplifier 12 for NORMAL outputs a voltage indicating a reasonable logical value by comparing the output voltage Va' or Vb' of the memory cell with the threshold voltage Vnormal. That is, according to the mechanism of a conventional semiconductor storage apparatus, even when an indication of the worsening of the data retention or the read disturb is present, it is difficult to detect the indication as an error.

Furthermore, when Va' varied from Va becomes lower than Vnormal or when Vb' varied from Vb becomes equal to or higher than Vnormal as the data retention or the read disturb becomes more serious, the sense amplifier 12 for NORMAL outputs a voltage indicating an unreasonable logical value. Thereby, in systems such as a microcomputer installed with the semiconductor storage apparatus, signals indicating the unreasonable logical value outputted from the sense amplifier 12 for NORMAL are used. Therefore, a possibility that system errors are caused to occur arises.

SUMMARY OF THE INVENTION

It is therefore an object of the invention to provide a semiconductor storage apparatus ensuring an improved reliability and a microcomputer having the semiconductor storage apparatus.

In order to achieve the above and other objects, according to an aspect of the invention there is provided a semiconductor storage apparatus having a nonvolatile memory and a first sense amplifier comparing the level of a read-out signal read out from the nonvolatile memory with a first reference level, the semiconductor storage apparatus comprising a detector operable to output, when detecting that a difference between the level of the read-out signal and the first reference level is smaller than a predetermined level difference, a detection signal indicative of the difference being smaller than the predetermined level difference.

The "detector" mentioned above includes, for example, a "sense amplifier for MRG1", a "sense amplifier for MRG0", an "error detection circuit" and "wiring for providing outputs of each sense amplifier to the error detection circuit", all of which will be described later.

According to the configuration of the semiconductor storage apparatus of the invention described above, even when the level of a read-out signal read out from a nonvolatile memory varies as a result of worsening of the data retention or the read disturb in the nonvolatile memory, the worsening can be detected in advance using the detection signal. Therefore, a semiconductor storage apparatus having a higher reliability can be provided.

In order to achieve the above and other objects, according to another aspect of the invention there is provided a microcomputer including a semiconductor storage apparatus and a processor, the semiconductor storage apparatus having a nonvolatile memory and a first sense amplifier comparing the level of a read-out signal read out from the nonvolatile memory with a first reference level, the processor controlling accesses to the nonvolatile memory, wherein the semiconductor storage apparatus comprises a detector operable to, when detecting that a difference between the level of the read-out signal and the first reference level is smaller than a predetermined level difference, output a detection signal indicative of the difference being smaller than the predetermined level difference, and wherein the processor comprises a controller operable to control, based on the detection signal, accesses to a storage area of the nonvolatile memory corresponding to the detection signal.

The "controller" mentioned above comprises, for example, an "interruption control unit", a "verification processing unit", each described later, and a "program counter" for controlling the interruption control unit and the verification control unit, and indispensable circuit elements for control of the semiconductor storage apparatus such as a "stack processing unit", a "RAM", an "accumulator" and a "μI register".

According to the configuration of a microcomputer according to the invention described above, even when the level of a read-out signal read out from a nonvolatile memory varies as a result of worsening of the data retention or the read disturb in the nonvolatile memory, the worsening can be detected in advance using the detection signal. Furthermore, the reliability can be improved by, for example, prohibiting accesses or rewriting the same content as that of data stored and retained in the nonvolatile memory, to the storage area of the nonvolatile memory corresponding to the detection signal.

Thus, a microcomputer having an improved reliability can be provided.

The invention thus enables a semiconductor storage apparatus having an improved reliability and a microcomputer having the semiconductor storage apparatus to be provided.

DESCRIPTION OF THE DRAWINGS

FIG. 2 illustrates the content of error determination by an error detection circuit according to an aspect of the invention.

DETAILED DESCRIPTION OF THE INVENTION

Throughout this description, the embodiments and examples shown should be considered as exemplars, rather than limitations on the apparatus and methods of the invention.

A. Systems

Figure 1:
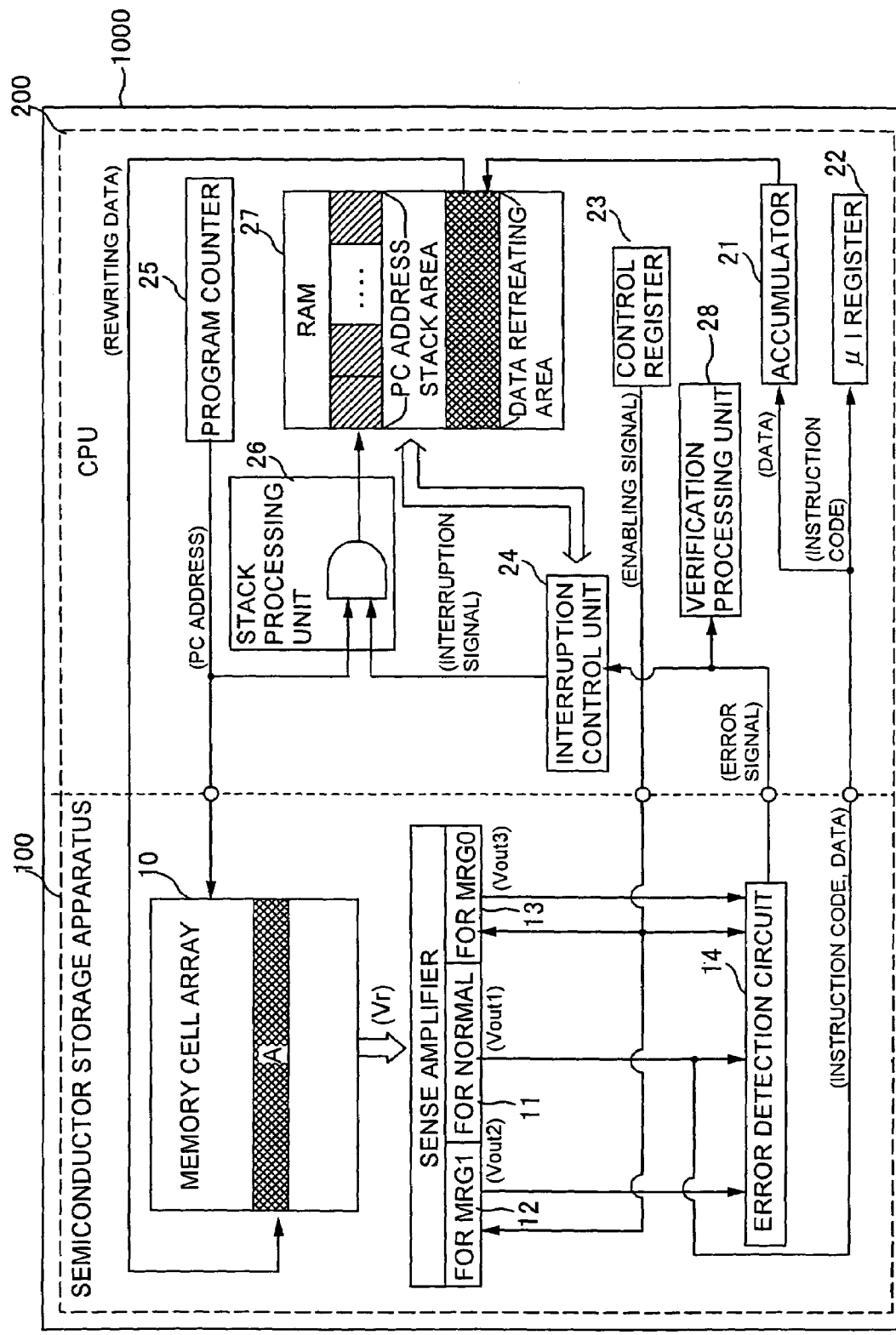
FIG. 1 is a block diagram of a microcomputer according to an aspect of the invention.

FIG. 1 shows a block diagram of a microcomputer 1000 according to the invention. As shown in the figure, the microcomputer 1000 comprises a semiconductor storage apparatus 100 and a CPU 200 (hereinafter, referred to as "processor").

1. Configuration of Semiconductor Storage Apparatus

Figure 4:
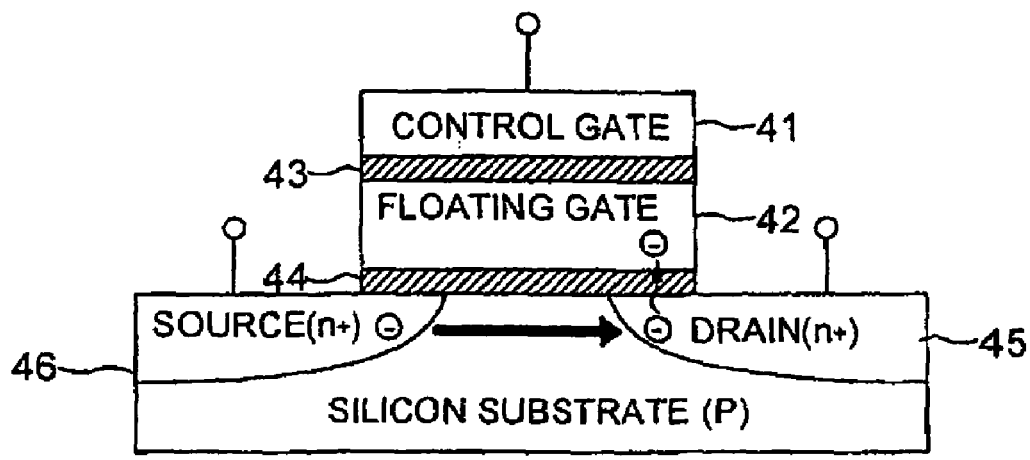
FIG. 4 shows the cross-sectional structure of a memory cell constituting a conventional semiconductor storage apparatus.
Figure 5:
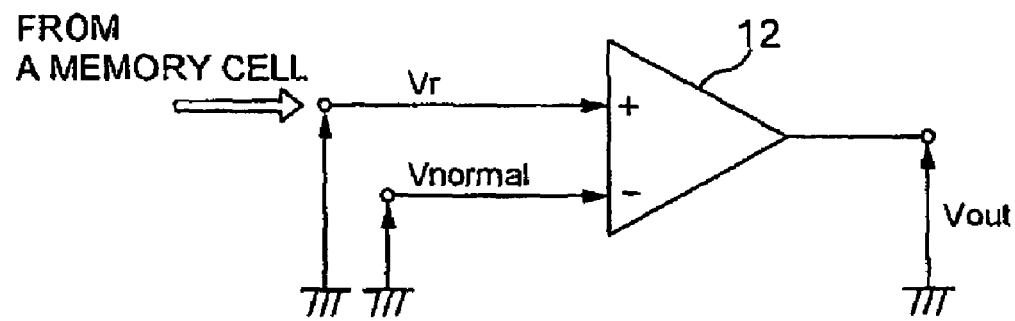
FIG. 5 illustrates the configuration of a sense amplifier in the conventional semiconductor storage apparatus.
Figure 6:
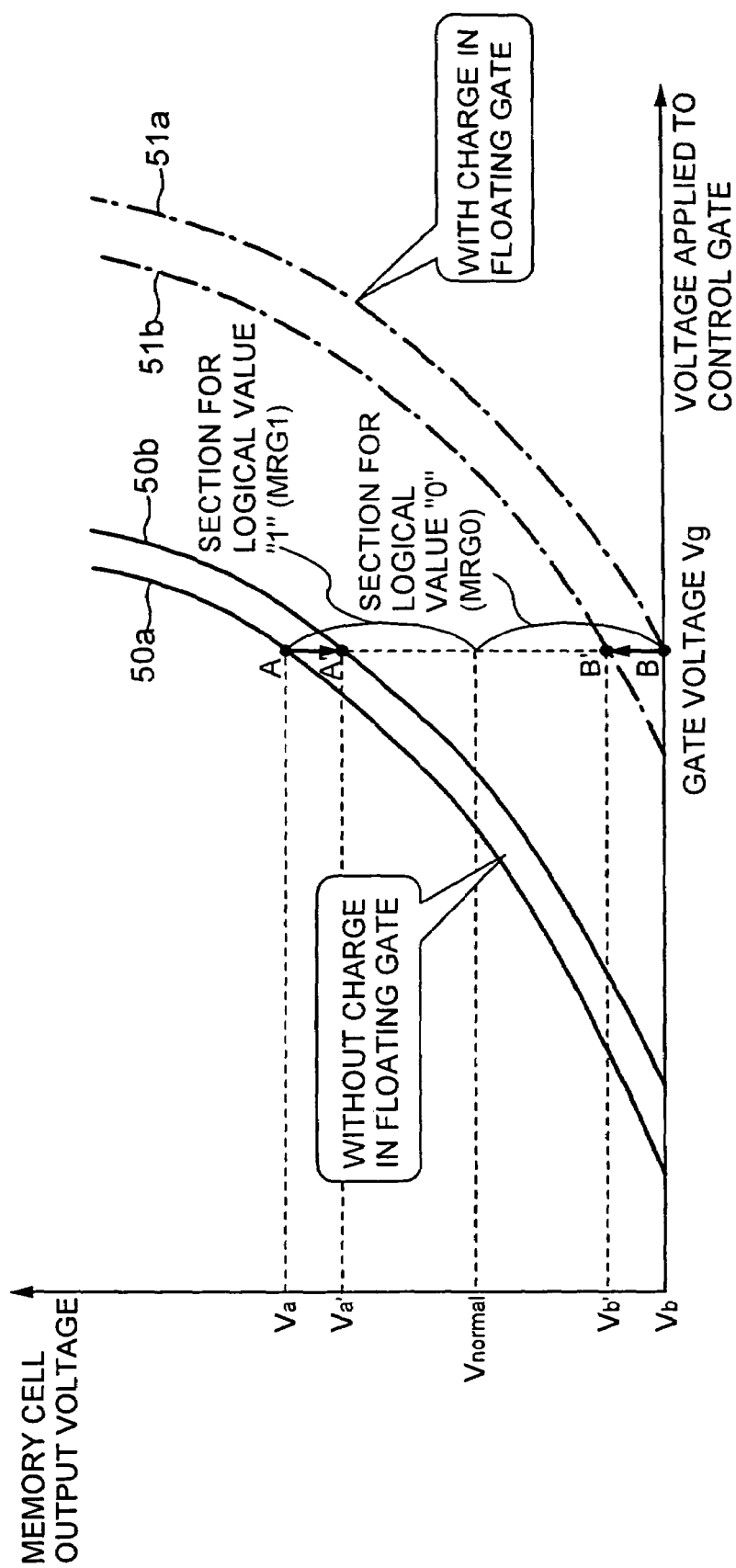
FIG. 6 illustrates a variation in the input/output characteristics of a memory cell.

First, the semiconductor storage apparatus 100 shows so-called nonvolatile that the data stored and retained in the memory cell is not deleted even when the power is turned off because the floating gate 42 into which electrons are injected is insulated by the insulating films 43 and 44 as shown in FIG. 4. That is, as the semiconductor storage apparatus 100, a nonvolatile memory device such as a flash memory or an EEPROM can be employed.

Furthermore, the semiconductor storage apparatus 100 comprises a memory cell array 10 (hereinafter, referred to as "nonvolatile memory"), a sense amplifier 11 for NORMAL (hereinafter, referred to as "first sense amplifier"), the sense amplifier 12 for MRG1 (hereinafter, referred to as "second sense amplifier"), a sense amplifier 13 for MRG0 (hereinafter, referred to as "third sense amplifier") and an error detection circuit 14 (hereinafter, referred to as "detection circuit").

The memory cell array 10 is constituted of a plurality of memory cells arranged, each as shown in FIG. 4, (storage areas for storing information of the smallest storage unit), each of which can determine whether or not the data stored and retained in the cell is "0" or "1" in response to the state of electron injection into the floating gate 42. The memory cell is constituted of, for example, a split-gate-type MOS transistor, a stacked-gate-type MOS transistor, etc. As the peripheral circuits for the memory cell array 10, in addition to the sense amplifiers 11 to 13 described later, known circuit elements for the semiconductor storage apparatus 100 such as an address decoder and a data register (both not shown) are provided.

The sense amplifier 11 for NORMAL compares the level of the read-out voltage Vr (hereinafter, referred to as "read-out signal") read out from a predetermined strobe position of each memory cell constituting the memory cell array 10 with the level of the predetermined threshold voltage Vnormal (hereinafter, referred to as "first reference level"), and outputs a voltage Vout1 corresponding to either of a logical value "0" indicating that the transistor of the memory cell is not conductive or a logical value "1" indicating that the transistor of the memory cell is conductive. For example, in the case where the transistor of the memory cell is not conductive, the level of the read-out voltage Vr becomes lower than the threshold voltage Vnormal and the sense amplifier 11 for NORMAL outputs a voltage Vout1 indicating the logical value "0". On the other hand, in the case where the transistor of the memory cell is conductive, the level of the read-out voltage Vr becomes equal to or higher than the threshold voltage Vnormal and the sense amplifier 11 for NORMAL outputs the voltage Vout1 indicating the logical value "1".

The sense amplifier 12 for MRG1 compares the level of the read-out voltage Vr described above with the level of a threshold voltage Vmrg1 (hereinafter, referred to as "second reference level") that is higher than the level of the threshold voltage Vnormal, and outputs a voltage Vout2 indicating the logical value "1" when the level of the read-out voltage Vr is equal to or higher than the level of the threshold voltage Vmrg1 or outputs the voltage Vout2 indicating the logical value "0" when the level of the read-out voltage Vr is lower than the level of the threshold voltage Vmrg1. Not that the level of the threshold voltage Vmrg1 is set at a magnitude for which MRG1 described later satisfies a predetermined allowance (margin).

The sense amplifier 13 for MRG0 compares the level of the read-out voltage Vr described above with the level of a threshold voltage Vmrg0 (hereinafter, referred to as "third reference level") that is lower than the level of the threshold voltage Vnormal, and outputs a voltage Vout3 indicating the logical value "1" when the level of the read-out voltage Vr is equal to or higher than the level of the threshold voltage Vmrg0 or outputs the voltage Vout3 indicating the logical value "0" when the level of the read-out voltage Vr is lower than the level of the threshold voltage Vmrg0. Note that the level of the threshold voltage Vmrg0 is set at a magnitude for which MRG0 described later satisfies a predetermined allowance (margin).

As described above, the case of a configuration in which a voltage sense amplifier circuit of a type for which voltages are inputted/outputted is employed as a configuration of each of the sense amplifiers 11 to 13 has been described. However, a current sense amplifier circuit of a type for which currents are inputted/outputted may be employed. However, when a current sense amplifier circuit is employed, each of the sense amplifiers 11 to 13 compares the level of a read-out current Ir (hereinafter, referred to as "read-out signal") read out from each of the memory cells constituting the memory cell array 10 with the levels of predetermined reference currents (hereinafter, referred to as "first to third reference levels"), and outputs voltages respectively indicating the logical value "0" or the logical value "1".

When the level of the read-out voltage Vr read out from the memory cell becomes equal to or higher than the threshold voltage Vnormal and indicates the logical value "1", the error detection circuit 14 determines whether or not a margin is present (whether or not a margin error is present) in the level difference MRG1 (hereinafter, referred to as "predetermined level difference") between the read-out voltage Vr and the threshold voltage Vnormal, indicating the section for which the logical value becomes "1". Furthermore, similarly, when the level of the read-out voltage Vr becomes lower than the threshold voltage Vnormal and indicates the logical value "0", the error detection circuit 14 determines whether or not a margin is present (whether or not a margin error is present) in the level difference MRG0 (hereinafter, referred to as "predetermined level difference") between the threshold voltage Vnormal and the read-out voltage Vr, indicating the section for which the logical value becomes "0". Then, when no margin is determined to be present in MRG1 and/or MRG0 described above, the error detection circuit 14 outputs to the CPU 200 an error signal (hereinafter, referred to as "detection signal") indicating that a margin error has occurred.

The error detection circuit 14 may realize the function described above using, for example, a logic circuit that executes the determination of margin error based on the voltages Vout1, Vout2 and Vout3 that are the outputs of the sense amplifiers 11 to 13 respectively as shown in FIG. 2.

First, in the case where "Vr>Vmrg1" shown in (a) in FIG. 2, the respective outputs of sense amplifiers 11 to 13 all indicate the logical value "1". Then, in the case where "Vmrg1>Vr>Vnormal" shown in (d) in FIG. 2, the respective outputs of sense amplifiers 11 to 13 all indicate the logical value "0". In the cases shown in (a) and (d) in FIG. 2, the error detection circuit 14 determines that the margin is normal and does not output any error signal because MRG1 and MRG0 have magnitudes that satisfy a predetermined margin degree.

Next, in the case where "Vmrg1>Vr>Vnormal" shown in (b) in FIG. 2, the output of the sense amplifier 12 for MRG1 indicates the logical value "0", that is different from the outputs of other sense amplifiers 11 and 13. Therefore, the logical values indicated by the respective outputs of sense amplifiers 11 to 13 do not coincide with one another. In this case, because MRG1 does not have the magnitude satisfying the predetermined margin degree, the error detection circuit 14 determines a margin error of MRG1 and outputs an error signal.

Furthermore, in the case where "Vmrg1>Vr>Vnormal" shown in (c) in FIG. 2, the output of the sense amplifier 13 for MRG0 indicates the logical value "1", that is different from the outputs of other sense amplifiers 11 and 12. Therefore, the logical values indicated by the respective outputs of sense amplifiers 11 to 13 do not coincide with one another. In this case, because MRG0 does not have the magnitude satisfying the predetermined margin degree, the error detection circuit 14 determines a margin error of MRG0 and outputs an error signal.

2. Configuration of CPU

The CPU 200 controls accesses such as writing, reading and deleting of data for each memory cell of the memory cell array 10. As the configuration of the CPU 200, as shown in FIG. 1, the CPU 200 has an accumulator 21, a μl register 22, a control register (hereinafter, referred to as "storage") 23, an interruption control unit 24, a program counter 25, a stack processing unit 26, a RAM 27 and a verification processing unit 28.

The accumulator 21 is a register for storing temporarily the data read out through the sense amplifier 11 for NORMAL from the memory cell array 10. The μl register 22 is also a register for storing temporarily the instruction codes read out through the sense amplifier 11 for NORMAL. When the CPU 200 does not receive any error signal from the error detection circuit 14, the CPU 200 executes ordinary processes such as execution of calculation processes to data stored in the accumulator 21 based on the result obtained from decoding the instruction codes stored in the µI register 22.

The control register 23 is a register for making settings for starting up and stopping of the sense amplifier 12 for MRG1 and the sense amplifier 13 for MRG0 as well as the error detection circuit 14. For example, flags for making the settings for starting up or stopping (for example, "1" is for a mode for starting up and "0" is for a mode for stopping) of the sense amplifiers 12 and 13 as well as the error detection circuit 14 are held in the control register 23 and the CPU 200 transmits enabling signals respectively corresponding to the values of the flags to the sense amplifiers 12 and 13 as well as the error detection circuit 14. Thereby, stopping of the operation of the sense amplifiers 12 and 13 as well as the error detection circuit 14 is allowed when the error detection circuit 14 does not need to carry out sensing of errors. Thereby, the power consumption can be reduced by the corresponding amount.

When the interruption control unit 24 receives an error signal from the error detection circuit 14, the interruption control unit 24 discontinues the reading-out from the memory cell array 10 currently executing and executes interruption control for rewriting (an interruption instruction) having been set in advance in an interruption vector in the RAM 27, to a storage area that is the target of the margin error (hereinafter, referred to as "error area"). In addition, the interruption control unit 24 transmits an interruption signal to the stack processing unit 26 in starting the execution of the interruption instruction described above.

When the CPU 200 executes accesses such as writing and reading to the storage areas of the memory cell array 10, the program counter 25 is a register for storing program counter addresses (hereinafter referred to as "PC addresses") that are incremented one after another as access destinations.

When the stack processing unit 26 receives the interruption signal from the interruption control unit 24, the stack processing unit 26 executes a process in which the current PC addresses stored in the program counter 25 are retreated (stacked) to a PC address stacking area provided to the RAM 27.

The RAM 27 is a memory provided in the CPU 200 and is segmented into the area for storing the interruption instructions given with the interruption vectors and the PC address stacking area as described above and, in addition, a data stacking area. The data stacking area is an area for stacking data stored in the error area of the memory cell array 10 when the interruption described above has occurred. The output of the sense amplifier 11 for NORMAL also indicates a reasonable logical value when a margin error is sensed by the error detection circuit 14. Therefore, the data having the same content as the content of the data stored in the error area of the memory cell array 10 can be rewritten into the error area.

After the rewriting to the error area has been executed according to the interruption instruction, the verification processing unit 28 determines whether or not the data rewritten is normal. More specifically, determination of whether or not any margin error is present in MRG1 and MRG0 is again carried out based on the output (error signal) of the error detection circuit 14 generated when the rewritten data are read out from the error area. Thereby, the reliability of the data stored and retained in the memory cell array 10 can be improved.

B. A Microcomputer

Figure 3:
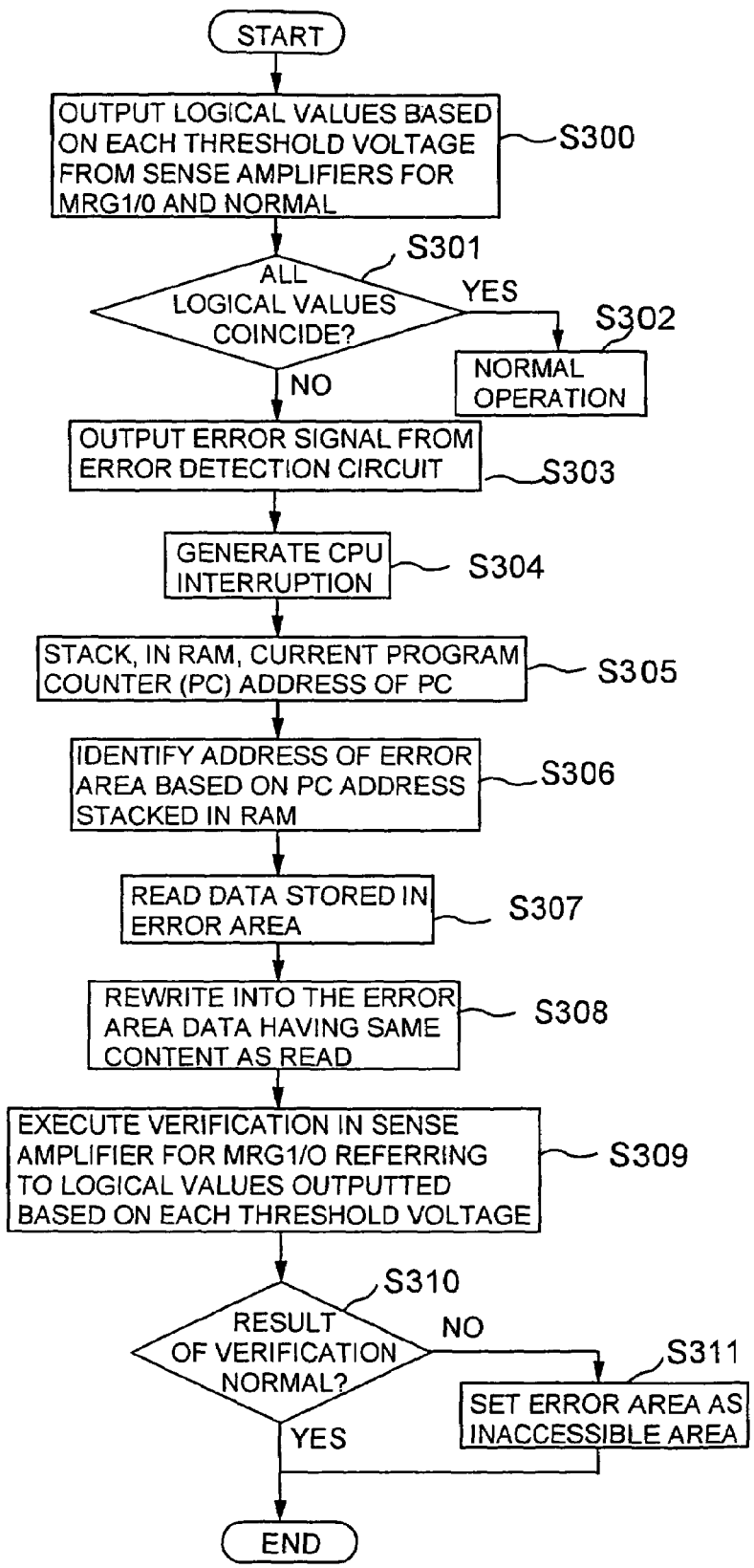
FIG. 3 is a flowchart illustrating the operation of the microcomputer according to an aspect of the invention.

The operation of the microcomputer according to the invention will be described with reference to the block diagram in FIG. 1 when necessary and based on the flowchart in FIG. 3.

First, in order to verify whether or not a margin error is present for the data stored and retained in the storage area (see FIG. 1) in the memory array cell 10, CPU 200 sets the flag value stored in the control register 23 at "1" indicating the start-up mode, as well as transmits enabling signals to the sense amplifiers 11 to 13 as well as the error detection circuit 14 of the semiconductor storage apparatus 100 based on the set flag value. As a result, the sense amplifiers 11 to 13 as well as the error detection circuit 14 are in start-up state.

Furthermore, in order to start reading of data stored and retained in each of the memory cells corresponding to the storage area A, the CPU 200 transmits to the semiconductor storage apparatus 100 the PC address as the read-out starting address in the storage area A set in the program counter 25, read-out control signals, etc. In the program counter 25, PC addresses are incremented one after another every time the read-out destination of the storage area A is changed.

On the other hand, the semiconductor storage apparatus 100 inputs to the sense amplifier 11 for NORMAL, the sense amplifier 12 for MRG1 and the sense amplifier 13 for MRG0 the read-out voltage Vr corresponding to the stored and retained data from a predetermined strobe position in the memory cell by, for example, applying a predetermined gate voltage Vg to a memory cell corresponding to the PC address received from the CPU 200, etc.

Each of the sense amplifiers 11 to 13 respectively compares the read-out voltage Vr inputted from the memory cell array 10 with each of the threshold voltages (the threshold voltage Vnormal, the threshold voltage Vmrg1 and the threshold voltage Vmrg0), and provides the voltage Vout1, the voltage Vout2 and the voltage Vout3 respectively indicating the logical value "0" or the logical value "1" to the error detection circuit 14 (S300). The voltage Vout1 that is the output of the sense amplifier 11 for NORMAL is stored in the accumulator 21 or the µI register 22 of the CPU 200 as the stored and retained data of the memory cell.

The error detection circuit 14 determines whether or not the logical values indicated by the voltage Vout1, the voltage Vout2, and the voltage Vout3 provided respectively from each of the sense amplifiers 11 to 13 all coincide with one another (S301). Here, when the logical values all coincide with one another (S301: YES), the error detection circuit 14 determines the state as normal because no margin error is present in MRG1 and MRG0. As a result, the CPU 200 executes the read-out process continuously as usual (S302). On the other hand, when the logical values do not all coincide with one another (S301: NO), this indicates that a margin error has occurred in at least either of MRG1 or MRG0. Therefore, in order to generate an interruption to the CPU 200 for the read-out process currently being executed, the error detection circuit 14 transmits an error signal to the interruption control unit 24 of the CPU 200 (S303).

Triggered by receiving the error signal from the error detection circuit 14, the interruption control unit 24 generates an interruption (S304) and transmits an interruption signal to the stack processing unit 26 prior to the execution of a rewrite instruction set in the interruption vector of the RAM 27. Then, the interruption control unit 24 causes the current PC addresses stored in the program counter 25 to retreat to the PC address stacking area of the RAM 27 through the stack processing unit 26 (S305).

After the retreating of the PC addresses, the interruption control unit 24 executes interruption control for executing the rewrite having been set in advance in the interruption vector of the RAM 27, to the storage area A containing the memory cell for which the margin error has occurred. At this time, the interruption control unit 24 identifies the address of the error area containing the memory cell for which the margin error has occurred based on the PC addresses retreated in the PC stack area of the RAM 27 (S306).

Based on this identified address, the interruption control unit 24 causes the stored and retained data read out from the error area of the memory cell array 10, to retreat to the data retreat area of the RAM 21 directly or after storing the data temporarily in the accumulator 21 (S307). Then, the interruption control unit 24 executes rewriting of rewrite data having the same content as the content of the retreated stored and retained data, into the error area of the memory cell array 10 (S308).

Next, after the rewriting has been executed to the error area, the verification processing unit 28 executes verification (verify) of whether or not the rewritten data is normally written by again determining whether or not a margin error is present in MRG1 and MRG0 based on the output of the error detection circuit 14 generated when the rewritten data is read out from the error area (S309).

If the result of the verification by the verification processing unit 28 indicates that the rewriting is normal (S310: YES), the CPU 200 executes a process defined as the sequence after the error sensing. If the result of the verification indicates that the rewriting is not normal (S310: NO), the CPU 200 makes settings for prohibiting subsequent accesses to the error area (S311). As the settings for this prohibition of accesses, for example, the settings can be made by registering the error area as a defective area into a status area provided to each segmented area of the memory cell array 10.

In this manner, even when the level of the read-out voltage Vr of the memory cell varies as the data retention or the read disturb becomes more serious, a microcomputer installed with the semiconductor storage apparatus according to an aspect of the invention can sense the variation in advance by determining whether or not a margin error is present in MRG1 and MRG0 by comparing the read-out voltage Vr with the threshold voltage Vmrg0 and the threshold voltage Vmrg1.

Furthermore, as the data retention or the read disturb becomes more serious, to the memory cell to which a margin error has occurred in MRG1 or MRG0, by executing rewriting using the same content as the content of the data stored and retained in the memory cell, the storage and retention characteristics of the memory cell can be restored including the case where the restoration is temporary.

That is, according to an aspect of the invention, a semiconductor storage apparatus and a method for verifying a nonvolatile memory thereof and a microcomputer and a method for controlling a nonvolatile memory thereof, all having improved reliability, can be provided.

Although the invention has been described specifically based on the embodiment, the invention is not limited thereto and can be variously modified without departing from the spirit thereof.

For example, in the embodiment described above, the interruption control unit 24 of the CPU 200 may generate an interruption process, triggered by the receiving of the error signal from the error detection circuit 14, and may prohibit at once accesses to the memory cell corresponding to the error signal. When MRG1 and MRG0 are extremely small as a result of the comparison of the read-out voltage Vr with the threshold voltage Vmrg0 and the threshold voltage Vmrg1 and the solution of this inconvenience is difficult, the above interruption can be an effective approach to improve the reliability of the memory cell array 10.

Furthermore, when rewriting is executed using the above interruption, rewriting data may be duplicated in a memory cell in another empty area. In addition, in the case described above where the result of the verification by the verification processing unit 28 indicates the rewriting is not normal, rewriting data may also be duplicated in a memory cell in another empty area using the same content as the content of the stored and retained data in a memory cell corresponding to the error signal. Thereby, the CPU 200 can execute continued read-out operation from the semiconductor storage apparatus 100.A Although exemplary embodiments of the invention have been shown and described, it will be apparent to those having ordinary skill in the art that a number of changes, modifications, or alterations to the invention as described herein may be made, none of which depart from the spirit of the invention. All such changes, modifications and alterations should therefore be seen as within the scope of the invention.

It is claimed:

1. A semiconductor storage apparatus having a nonvolatile memory and a first sense amplifier comparing the level of a read-out signal read out from the nonvolatile memory with a first reference level, the semiconductor storage apparatus comprising:
    a detector operable to output, when detecting that a difference between the level of the read-out signal and the first reference level is smaller than a predetermined level difference, a detection signal indicative of the difference being smaller than the predetermined level difference,
    Wherein the detector includes:
    a second sense amplifier operable to compare the level of the read-out signal with a second reference level that is higher than the first reference level, the second sense amplifier outputting a logical value corresponding to the level of the read-out signal;
    a third sense amplifier operable to compare the level of the read-out signal with a third reference level that is lower than the first reference level, the third sense amplifier outputting a logical value corresponding to the level of the read-out signal; and
    a detection circuit operable to be fed with the logical values outputted from the first to the third sense amplifiers, the detection circuit outputting the detection signal when all of the logical values do not coincide with one another.

2. A semiconductor storage apparatus according to claim 1, wherein the detector is set for starting up or stopping of the operation based on an enable signal.

3. A microcomputer including a semiconductor storage apparatus and a processor, the semiconductor storage apparatus having a nonvolatile memory and a first sense amplifier comparing the level of a read-out signal read out from the nonvolatile memory with a first reference level, the processor controlling accesses to the nonvolatile memory, wherein the semiconductor storage apparatus comprises:
    a detector operable to, when detecting that a difference between the level of the read-out signal and the first reference level is smaller than a predetermined level difference, output a detection signal indicative of the difference being smaller than the predetermined level difference, and wherein the processor comprises:

a controller operable a control, based on the detection signal, accesses to a storage area of the nonvolatile memory corresponding to the detection signal, Wherein the detector includes:

a second sense amplifier operable to compare the level of the read-out signal with a second reference level that is higher than the first reference level, the second sense amplifier outputting a logical value corresponding to the level of the read-out signal;

a third sense amplifier operable to compare the level of the read-out signal with a third reference level that is lower than the first reference level, the third sense amplifier outputting a logical value corresponding to the level of the read-out signal; and a detection circuit operable to be fed with the logical values outputted from the first to the third sense amplifiers, the detection circuit outputting the detection signal when all of the logical values do not coincide with one another.

4. A microcomputer according to claim 3, wherein the controller rewrites the same content as that of the read-out signal to a storage area of the nonvolatile memory corresponding to the detection signal.

5. A microcomputer according to claim 4, wherein the controller includes:

a verifier operable to verify, upon rewriting, whether or not the rewriting has been normally executed based on the detection signal outputted from the detector.

6. A microcomputer according to claim 5, wherein when the rewriting has not been verified normal by the verifier, the controller prohibits accesses to a storage area of the nonvolatile memory subjected to the rewriting.

7. A microcomputer according to claim 3, wherein the processor includes a storage operable to store an enable signal, to be transmitted to the detector, for setting starting-up or stopping of the detector.

* * * * *